United States Patent [19]

Neustadt

[11] Patent Number: 5,663,988
[45] Date of Patent: Sep. 2, 1997

[54] METHOD AND CIRCUIT ARRANGEMENT FOR OFFSET CORRECTION IN A TDMA RADIO RECEIVER

[75] Inventor: Alf Neustadt, Stuttgart, Germany

[73] Assignee: Alcatel SEL Aktiengesellschaft, Stuttgart, Germany

[21] Appl. No.: 4,435

[22] Filed: Jan. 14, 1993

[30] Foreign Application Priority Data

Jan. 18, 1992 [DE] Germany ............... 42 01 194.9

[51] Int. Cl.⁶ .................................. H04L 25/06
[52] U.S. Cl. ............................ 375/319; 327/307
[58] Field of Search .................. 327/307; 375/317, 375/319, 316; 348/257, 677

[56] References Cited

U.S. PATENT DOCUMENTS

| | | | |
|---|---|---|---|
| 4,186,384 | 1/1980 | Acker | 375/76 |
| 4,535,294 | 8/1985 | Ericksen et al. | |
| 4,736,391 | 4/1988 | Siegel | 330/259 X |
| 4,873,702 | 10/1989 | Chiu | |
| 4,893,317 | 1/1990 | Critchlow et al. | 375/97 |
| 4,941,155 | 7/1990 | Chuang et al. | 375/84 |
| 5,027,352 | 6/1991 | Goode | 370/110.1 |
| 5,052,027 | 9/1991 | Poklemba et al. | |
| 5,081,652 | 1/1992 | Farahati et al. | 375/97 |
| 5,245,611 | 9/1993 | Ling et al. | 375/114 X |

FOREIGN PATENT DOCUMENTS

| | | |
|---|---|---|
| 0318684 | 6/1989 | European Pat. Off. |
| 9105427 | 4/1991 | WIPO ............... H04L 25/06 |

OTHER PUBLICATIONS

Cupo et al., "Adaptive Carrier Recovery Systems for Digital Data Communications Receivers." IEEE Journal on Selected Areas in Comm. vol. 7. No. 9. Dec. 1989 pp. 1328–1339.

"Instrumentation & Techniques—Automated Offset Compensation for DC Biopotential Measurements", T. Collura et al, *Behavior Research Methods, Instruments & Computers* 1990, 22(1), 13–20.

*Primary Examiner*—Tesfaldet Bocure
*Assistant Examiner*—Bryan E. Webster
*Attorney, Agent, or Firm*—Ware, Fressola, Van Der Sluys & Adolphson LLP

[57] ABSTRACT

The levels of received time-division multiple access (TDMA) signals may vary widely from section to section. In DC-coupled amplifier circuits, the received signals are distorted by offset voltages. Conventional correcting or balancing methods use control mechanisms which do not allow for level variations or offset drift and tend to result in miscompensation of individual signal sections. Other methods depend on time intervals defined in the received signal and having a known average value. It is the object of the invention to provide a correcting method and a circuit arrangement for carrying out the same which achieve a self-adjusting, not widely varying (floating) correction value, thus avoiding miscompensation. This is accomplished by selecting the individual time slots in a comparator with the aid of limit value.

7 Claims, 2 Drawing Sheets

METHOD AND CIRCUIT ARRANGEMENT FOR OFFSET CORRECTION IN A TDMA RADIO RECEIVER

TECHNICAL FIELD

The present invention relates t signal conditioning and, more particularly, to a method of correcting offset in a DC-coupled amplifier circuit.

BACKGROUND OF THE INVENTION

Offset voltages in DC-coupled amplifier circuits are balanced in various ways.

A conventional method is to balance the respective amplifier circuit once upon start-up by applying a compensation voltage to its input. This does not take into account any subsequent changes in offset voltage due to thermal drift or the like.

Furthermore, methods are known which permit two or more offset-balancing operations by means of an automatic control system.

In this connection, reference is made, for example, to an article by T. F. Collura et al., "Automated offset compensation for DC biopotential measurements", published in "Behavior Research Methods, Instruments & Computers", 1990, 22(1).

The levels of the received signals may vary from section to section (from time slot to time slot). That is the case particularly in TDMA radio receivers, which, like the GSM standard, have a time-slot allocation to fixed (time) channels, so that according to the different transmission conditions in the individual channels (coming from different transmitters), levels occur which vary widely from time slot to time slot.

Offset correction methods for input signals with levels changing section by section, as occur particularly in TDMA radio receiver, are presented, inter alia, in U.S. Pat. No. 4,873,702 and in Patent Application PCT/US90/05358.

In both methods, a time interval defined in the respective section and having a known average value ("preamble signal" and "DC compensation signal", respectively) is used to determine the correction value. This value, according to the principle of the above methods, is not affected by the variations of the input signal levels. For input signals having no such time intervals, the above methods cannot provide meaningful offset correction. If such time intervals are available, however, their evaluation for determining a suitable correction value will be particularly problematic if the incoming signal is significantly distorted within a time-slot duration.

That is the case, inter alia, with fading or multipath as occur in radio systems as specified in the GSM standard, for example. These effects also change the above-mentioned time intervals ("preamble signal" and "DC compensation signal", respectively) so that correction values determined therefrom may differ considerably from the actual offset value to be compensated, and thus may result in miscompensation.

DISCLOSURE OF INVENTION

It is the object of the invention to provide a correcting method and a circuit arrangement operating according to this method which achieve a self-adjusting, not widely varying (floating) correction value, thus avoiding miscompensation.

According to one aspect of the present invention, offset is corrected in a DC-coupled amplifier circuit by adding a correction value (K) to an input signal (E), said correction value (K) being determined with the aid of an averaging operation (MB), wherein for an input signal with levels (PS) changing from section to section, only those sections are used to determine the correction value whose levels are below a variable limit value (PG).

According to another aspect of the present invention, a circuit for correcting offset in a DC-coupled amplifier adds a correction value (K) to an input signal (E), said correction value (K) being determined with the aid of an averaging operation (MB), wherein the circuit includes a comparator (KOMP) which, to determine the correction value, selects from an input signal with levels (PS) changing from section to section only those sections whose levels are below a variable limit value (PG).

According to the invention, the individual sections are selected in a comparator with the help of a limit value, using only sections with low levels to determine the correction value. In sections with high levels, the share of the actual offset in the total DC component of the individual section (average value) is smaller than in sections with low levels. To form a meaningful correction value, the actual offset value must be determined as accurately as possible.

Averaging over each of the sections with low levels provides average values which (depending on the choice of the limit value) do not deviate too much from the actual offset value.

To form the correction value, this is followed by an evaluation of these average values, i.e., by the (weighted) summation over a large number of individual average values. Since the original received signal according to the GSM standard is DC-component-free over a long period of time, i.e., since long-term averaging over the received signal, which is not distorted by offset, results in a value which tends to zero, the above evaluation provides a correction value which is nearly equal to the actual offset value. Through the selection, the correction value is not affected by time slots with higher levels, so that miscompensation is avoided.

The determination of the correction value by evaluation of a number of average values (selected time slots) results in a floating, not widely varying correction value.

In further accord with the present invention, the averaging for determining the correction value takes place "only" over partial intervals of the selected time slots. This eliminates timeintensive averaging over complete time slots and permits a faster correction. Moreover, redundant bits provided at the beginning and end of each time slot to compensate for differences in signal delays are not covered by the averaging. Furthermore, even time slots with a duration shorter than the original one (e.g., short test time slots during the establishment of a connection, access bursts) can be evaluated without having to change any parameters of the method. The duration of a partial interval, however, must not exceed the duration of one of these short time slots.

According still further to the present invention, an improvement in the determination of the correction value from several selected time slots is taught. By suitable weighting, real ratios of the proportion of the current time slot (weighted average) and the proportion of previous time slots (previous correction value(s)) can be adjusted. The intensity of the variations of the correction value is thus steplessly adjustable.

In still further accord with the present invention 4, the limit value, by means of which the time slots are selected, is not necessarily a fixed quantity, but a quantity which, according to requirements (evaluation), is determined by the input signal and controls the selection of the time slots. This makes it possible, for example, to avoid the condition in which in the presence of an input signal with continuously high levels, no time slot or only few time slots are selected. The correction can also be influenced via defined time slots in the input signal (control intervals).

Further still in accordance with the present invention, the limit value is variable with time. Thus, temporary conditions (e.g., start and turn-on conditions) can be taken into account in the determination of the correction value.

Through an initial, temporary increase of the limit value upon start-up of the radio receiver, an average will be taken even if the levels of the initially arriving sections are greater than the limit value. Thus, the correction value will not remain at its start level (e.g., at zero).

In still further accord with the present invention, a minimum required correction and a maximum permissible correction of the input signal are determined. The limitation determines a maximum permissible relative influence by the correction value on the input value.

The limitation could advantageously be determined from the expected average level swing of the input signal. Thus, in the case of a long level sequence with like signs, summation of the correction value beyond the average level would be avoided.

These and other objects, features and advantages of the present invention will become more apparent in light of the detailed description of a best mode embodiment thereof, as illustrated in the accompanying drawing.

BEST MODE FOR CARRYING OUT THE INVENTION

Figure 1:
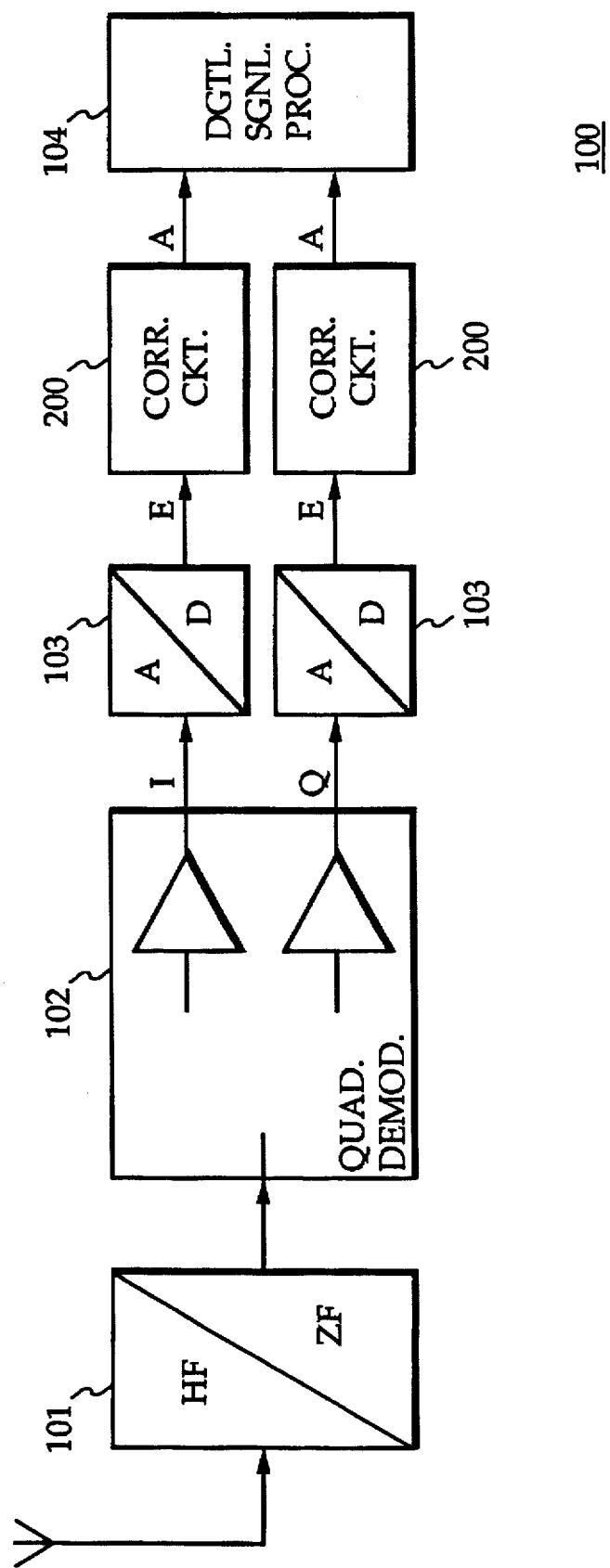
FIG. 1 show a TDMA radio receiver circuit, according to the present invention with an offset correction circuit in both the I branch (in-phase component I) and the Q branch (quadrature component Q)

The TDMA radio receiver circuit 100 of FIG. 1 contains an antenna followed by a mixer 101, a quadrature demodulator 102 coupled to the output of the mixer and followed by two analog-to-digital converters 103, a respective off-set correction circuit 200 following each of the analog-to-digital converters, and a circuit for further digital signal processing 104 connected to the outputs of the two offset correction circuits.

The inputs E (with levels changing from time slot to time slot) to the offset correction circuits are distorted by offset voltages in the amplifier stages (e.g., in the quadrature demodulator, A/D converter), and after correction are available as outputs A of the offset correction circuits for further digital signal processing.

The input signal in this embodiment has a time-slot duration of 577 μs, which corresponds to a defined number of 156.25 bits. Normally, 142 fixed bits are transmitted, of which the middle 64 bits, representing a partial interval, are used to determine the correction value. The number 64 represents a power of two and permits fast and simple digital evaluation. The levels of the input signal lie within an amplitude range of approximately $10^{-3}$–10 V.

The offset voltages to be corrected can reach a value of about $10^{-1}$ V and a drift of about 10 mV/min.

Figure 2:
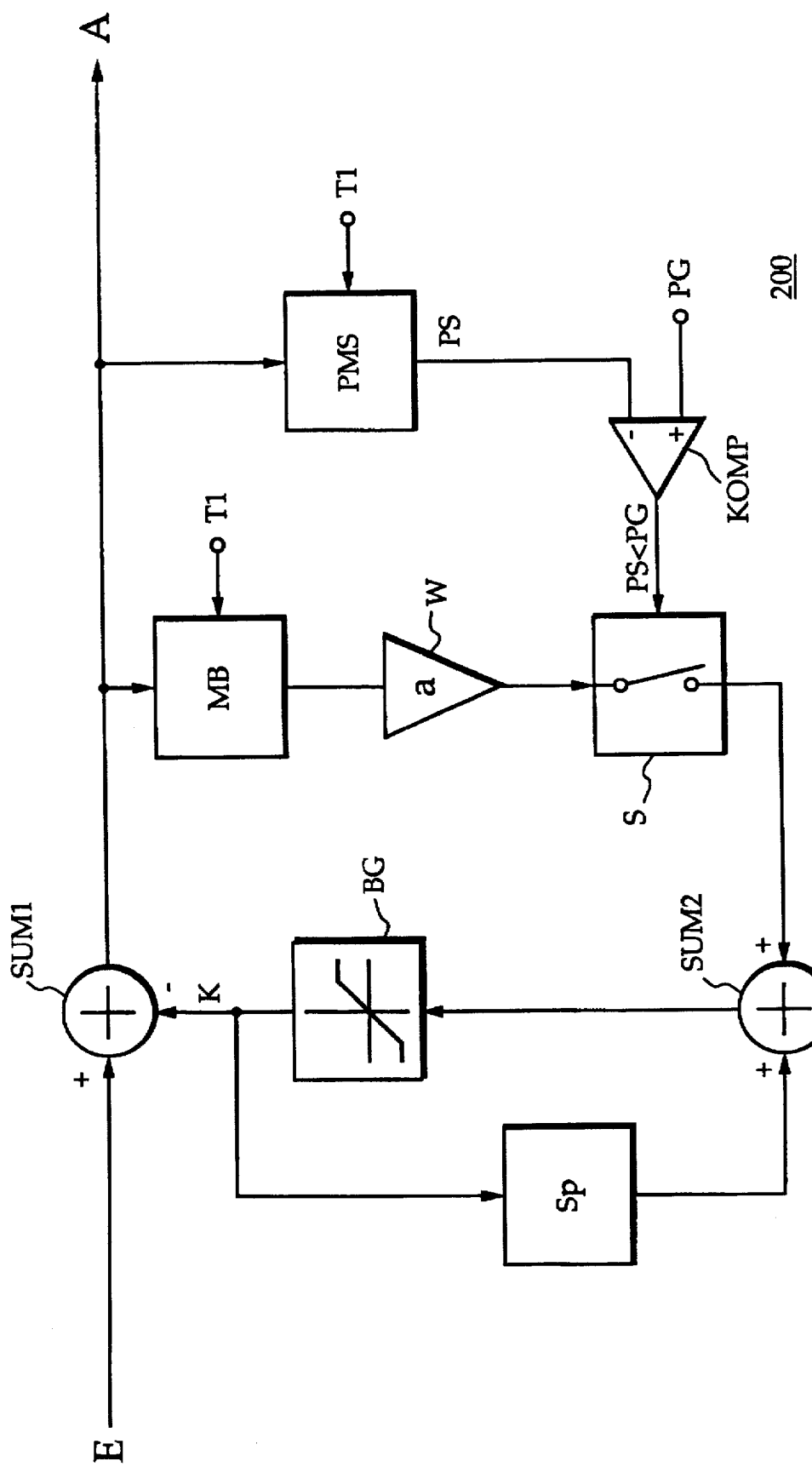
FIG. 2 shows an offset correction circuit.

FIG. 2 shows the offset correction circuit 200 with a first summing stage SUM1, a second summing stage SUM2, an averaging stage MB, a level-measuring stage PMS, a comparator KOMP, a weighting stage W (with a weighting factor of 0<a<1), a memory Sp, a switching stage S and a limiter BG.

The input signal E is applied to the first summing stage SUM1, where it is combined, time slot by time slot, with a correction value K such that at the output of the summing stage SUM1, the output signal A appears as a difference of A=E−K. The correction value K is determined as follows:

The output signal A is applied, inter alia, to the level-measuring stage PMS, in which the amplitude level of the output signal A or a quantity derived therefrom (e.g., level) is determined. The level-measuring stage is reset at the beginning of each time slot and remains active over a period T1 which is shorter than the time-slot duration. The output PS of the level-measuring stage is then compared with a limit value PG in a comparator KOMP. The limit value may be both a fixed quantity and a variable (e.g., such that the limit value is reduced with increasing "on" period). In the embodiment, the limit value lies in the range from about 10%–50% of the maximum received signal level (PG=[0.1 ... 0.5]PS max).

The comparator KOMP controls the switching stage S in accordance with the above comparison as follows:

a) If the output PS, considered over one time slot, is less than the limit value PG (PS<PG), the switching stage S will become active for this time Slot, and the average determined in the time slot over the period T1 will be applied through the weighting stage W to one input of the second summing stage SUM2. To achieve a highly stable correction value, the weighting factor a is chosen very small in the embodiment, namely a=approximately 0.01.

The inputs of the second summing stage SUM2 are fed with the weighted average and the (old) correction value stored in the memory Sp. The sum is applied to the input of the limiter BG. If required, the latter can restrict the amplitude range of the next correction value K to be represented for the next time slot. Accordingly, if PS<PG (low level), a correction value K will appear which is formed from the stored (old) correction value and a weighted portion of the (current) average.

b) If the output PS, considered over one time slot, is greater than the limit value PG (PS<PG) or equal to this value (PS=PG), the switching stage S will be switched to the inactive state for this time slot. The output of the memory (old correction value), which is fed directly to the second summing stage SUM2, will be applied there as the only input. As a result, the output of the limiter BG will provide a correction value K which corresponds to the old memory value (old correction value). The memory value will not change and will be fed as a constant correction value K to the first summing stage SUM1.

Other embodiments of the invention are conceivable which do not use recursive control but determine directly from the input signal a correction value which is (subsequently) added to the input signal to balance the offset voltage (feedforward control). Digital signal processors (DSPs) can be used to advantage implementing various embodiments. Analog embodiments of the invention are also conceivable.

I claim:

1. A method of correcting offset in a DC-coupled amplifier circuit by adding a correction value (K) to an input signal (E) having successive sections, said input signal having amplitude levels (PS) which change from section to section the method comprising the steps of:

selecting those sections of said input signal whose amplitude levels (PS) are below a variable limit value (PG);

determining said correction value (K) with the aid of an averaging operation carried out by an averaging stage (MB) of said amplifier circuit on said input signal, said averaging operation including averaging only said selected sections of said input signal whose amplitude levels are below said variable limit value; and adding said correction value to said input signal;

whereby for an input signal with amplitude levels (PS) changing from section to section, only those sections are used to determine the correction value whose amplitude levels are below said variable limit value (PG).

2. A method as claimed in claim 1 wherein the input signal is a TDMA signal, consisting of frames with n time slots, and wherein the sections used are the time slots, and that the averaging is performed over partial intervals of the same.

3. A method as claimed in claim 1, wherein the correction value is determined continuously by adding the previous correction value or two or more previous correction values and a weighted value of the average determined by the averaging operation.

4. A method as claimed in claim 1, wherein the limit value is obtained by evaluating the input-signal amplitude levels or variables derived therefrom.

5. A method as claimed in claim 1, wherein the limit value is subject to particular variations with time.

6. A method as claimed in claim 1, wherein the correction value lies within a particular range of values.

7. A circuit arrangement for correcting offset in a DC-coupled amplifier circuit by adding a correction value (K) to an input signal (E), said input signal having successive sections, wherein amplitude levels (PS) of said input signal change from section to section, said correction value (K) being determined with the aid of an averaging operation, wherein the circuit arrangement includes:

a comparator (KOMP) responsive to said input signal for selecting only those sections of said input signal whose amplitude levels are below a variable limit value (PG); and an averaging stage (MB) for performing said averaging operation including averaging the selected sections of said input signal whose amplitude levels are below said variable value (PG) for determining said correction value.

* * * * *